(12) United States Patent
Shin et al.

(10) Patent No.: US 11,968,854 B2
(45) Date of Patent: Apr. 23, 2024

(54) FOLDING DISPLAY DEVICE INCLUDING DETACHABLE PROTECTIVE FILM

(71) Applicant: Samsung Display Co., Ltd., Yongin-si (KR)

(72) Inventors: Jaiku Shin, Hwaseong-si (KR); Dongjin Park, Seongnam-si (KR); Dongwoo Seo, Suwon-si (KR); Sung Chul Choi, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/547,172

(22) Filed: Dec. 9, 2021

(65) Prior Publication Data

US 2022/0246879 A1 Aug. 4, 2022

Related U.S. Application Data

(62) Division of application No. 16/809,395, filed on Mar. 4, 2020, now Pat. No. 11,245,089.

(30) Foreign Application Priority Data

Jul. 24, 2019 (KR) .......................... 10-2019-0089898

(51) Int. Cl.
*H10K 50/84* (2023.01)
*G06F 1/16* (2006.01)
*H10K 102/00* (2023.01)

(52) U.S. Cl.
CPC ........... *H10K 50/84* (2023.02); *G06F 1/1652* (2013.01); *H10K 2102/311* (2023.02)

(58) Field of Classification Search
CPC ............... H10K 50/84; H10K 50/8426; H10K 2102/311; G06F 1/1652
See application file for complete search history.

(56) References Cited

U.S. PATENT DOCUMENTS 9,682,886 B1 6/2017 Almanza-Workman et al.
9,967,375 B1 5/2018 Zhao et al.
(Continued)

FOREIGN PATENT DOCUMENTS

KR 10-2017-0122554 11/2017
KR 10-2018-0062273 6/2018
(Continued)

OTHER PUBLICATIONS

Non-Final Office Action dated Jun. 16, 2021, in U.S. Appl. No. 16/809,395.
(Continued)

*Primary Examiner* — Erik Kielin
(74) *Attorney, Agent, or Firm* — H.C. Park & Associates, PLC (57) ABSTRACT

A display apparatus including a display module having flexibility, a glass window disposed on the display module, a protective film including an adhesive layer detachably attached on the glass window, and a protecting layer disposed on the adhesive layer, a cover covering an edge of the glass window and configured to receive the display module, and a protective pattern including an edge adhesive layer attached on an edge of an upper surface of the glass window, and an edge protective layer disposed on the edge adhesive layer, in which an adhesion between the glass window and the edge adhesive layer of the protective pattern is greater than an adhesion between the glass window and the adhesive layer of the protective film.

5 Claims, 4 Drawing Sheets

(56) References Cited

U.S. PATENT DOCUMENTS

| | | |
|---|---|---|
| 10,191,516 B2 | 1/2019 | Jang et al. |
| 2013/0140965 A1 | 6/2013 | Franklin et al. |
| 2017/0047547 A1 | 2/2017 | Son et al. |
| 2017/0192462 A1 | 7/2017 | Kim et al. |
| 2018/0150106 A1 | 5/2018 | Jang et al. |
| 2020/0028117 A1* | 1/2020 | Eckert .................. C08J 5/18 |
| 2020/0051881 A1* | 2/2020 | Park .................. B32B 15/09 |
| 2020/0166974 A1 | 5/2020 | Ai et al. |

FOREIGN PATENT DOCUMENTS

| | | |
|---|---|---|
| KR | 10-1971964 | 4/2019 |
| WO | 2016024341 | 2/2016 |
| WO | WO-2020123758 A1 * | 6/2020 |

OTHER PUBLICATIONS

Notice of Allowance dated Sep. 30, 2021, in U.S. Appl. No. 16/809,395.

* cited by examiner

FOLDING DISPLAY DEVICE INCLUDING DETACHABLE PROTECTIVE FILM

CROSS-REFERENCE TO RELATED APPLICATIONS

This application is a Division of U.S. patent application Ser. No. 16/809,395, filed on Mar. 4, 2020, which claims priority from and the benefit of Korean Patent Application No. 10-2019-0089898, filed on Jul. 24, 2019, each of which is hereby incorporated by reference for all purposes as if fully set forth herein.

BACKGROUND

Field

Exemplary embodiments of the invention relate generally to a display apparatus, and more particularly, to a display apparatus capable of improving display quality.

Discussion of the Background

Recently, a display apparatus having light weight and small size is being manufactured. A cathode ray tube (CRT) display apparatus has been widely used due to a performance and a competitive price. However, a CRT display apparatus has a relatively large size or a lack of portability. As such, a display apparatus, such as a plasma display apparatus, a liquid crystal display apparatus, and an organic light emitting display apparatus has been highly regarded due to its small size, light weight, and low power consumption.

An organic light emitting display OLED apparatus emits light by combining holes provided from an anode and electrons provided from a cathode in a light emitting layer between the anode and the cathode. The organic light emitting display apparatus generally provides wider viewing angle, faster response speed, thin thickness, and lower power consumption over a conventional display apparatus.

Recently, technologies for implementing a flexible display apparatus that can be bent using the organic light emitting diode have been developed. The flexible display apparatus, however, is less susceptible to external impacts than a typical display apparatus, which may cause problems due to damage to components.

The above information disclosed in this Background section is only for understanding of the background of the inventive concepts, and, therefore, it may contain information that does not constitute prior art.

SUMMARY

Display devices constructed according to exemplary embodiments of the invention are capable of preventing breakage of glass window and scattering of fragments when the display apparatus is broken.

Additional features of the inventive concepts will be set forth in the description which follows, and in part will be apparent from the description, or may be learned by practice of the inventive concepts.

A display apparatus according to an exemplary embodiment includes a display module having flexibility, a glass window disposed on the display module, a protective film including an adhesive layer detachably attached on the glass window and a protecting layer disposed on the adhesive layer, a protective coating pattern disposed on an edge of an upper surface of the glass window, and a cover covering at least a portion of an edge of the glass window and configured to receive the display module, in which the protective coating pattern partially overlaps the adhesive layer of the protective film.

The glass window may include an ultra thin glass having a thickness of about 300 µm or less, and a modulus of the protective coating pattern may be less than about 1 GPa.

The cover may include a bottom plate, side wall extending from an edge of the bottom plate, and a top plate extending in a direction substantially parallel to the bottom plate, and the top plate may partially overlap the protective coating pattern.

The top plate may be spaced apart from the protective film.

The display apparatus may further include a light blocking pattern disposed on an edge of the bottom surface of the glass window, in which the glass window may have a planar area greater than that of the display module.

The light blocking pattern may partially overlap the display module.

The light blocking pattern may overlap the protective coating pattern, and a width of the light blocking pattern may be greater than a width of the protective coating pattern.

The display module may include a first display area, a second display area spaced apart from the first display area, and a folding area disposed between the first display area and the second display area, along which the display module is configured to be folded.

The display module may include a flexible organic light emitting display panel.

The protective coating pattern may include a urethane-based resin.

The adhesive layer of the protective film may include a pressure sensitive adhesive and the protective layer may include plastic.

In an exemplary embodiment, the glass window may further include a functional coating layer disposed on an upper surface of the glass window.

A display apparatus according to another exemplary embodiment includes a display module having flexibility, a glass window disposed on the display module, a protective film including an adhesive layer detachably attached on the glass window, and a protecting layer on the adhesive layer, and a cover covering an edge of the glass window and configured to receive the display module, a protective pattern including an edge adhesive layer attached on an edge of an upper surface of the glass window, and an edge protective layer disposed on the edge adhesive layer, in which an adhesion between the glass window and the edge adhesive layer of the protective pattern is greater than an adhesion between the glass window and the adhesive layer of the protective film.

The cover may include a bottom plate, side wall extending from an edge of the bottom plate, and a top plate extending in a direction substantially parallel to the bottom plate, and the top plate may partially overlap the protective coating pattern.

The display apparatus may further include a functional coating layer disposed on the upper surface of the glass window between the glass window and the protective film, in which the adhesion between the glass window and the edge adhesive layer of the protective pattern may be greater than an adhesion between the functional coating layer and the adhesive layer of the protective film.

A distance from the glass window to a lower surface of the protective layer of the protective film may be equal to or greater than a distance from the glass window to the upper surface of the edge protective layer of the protective pattern, and the protective pattern may partially overlap the protective layer of the protective film.

The display apparatus may further include a light blocking pattern disposed on an edge of the bottom surface of the glass window, in which the glass window may have a planar area greater than that of the display module, and may be disposed to protrude further outwardly than an edge of the display module.

A display apparatus according to still another exemplary embodiment includes a display module having flexibility, a glass window disposed on the display module, a protective film including an adhesive layer detachably attached on the glass window, and a protecting layer disposed on the adhesive layer, a cover covering an edge of the glass window and configured to receive the display module, and a protective pattern disposed on an edge of an upper surface of the glass window, and being partially exposed by the cover.

The protective pattern may include a protective coating pattern disposed on the glass window, and the protective coating pattern may partially overlap the protective film.

The protective pattern may include an edge adhesive layer attached to the edge of the upper surface of the glass window, and an edge protective layer disposed on the edge adhesive layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concept will be explained in detail with reference to the accompanying drawings.

Figure 1:
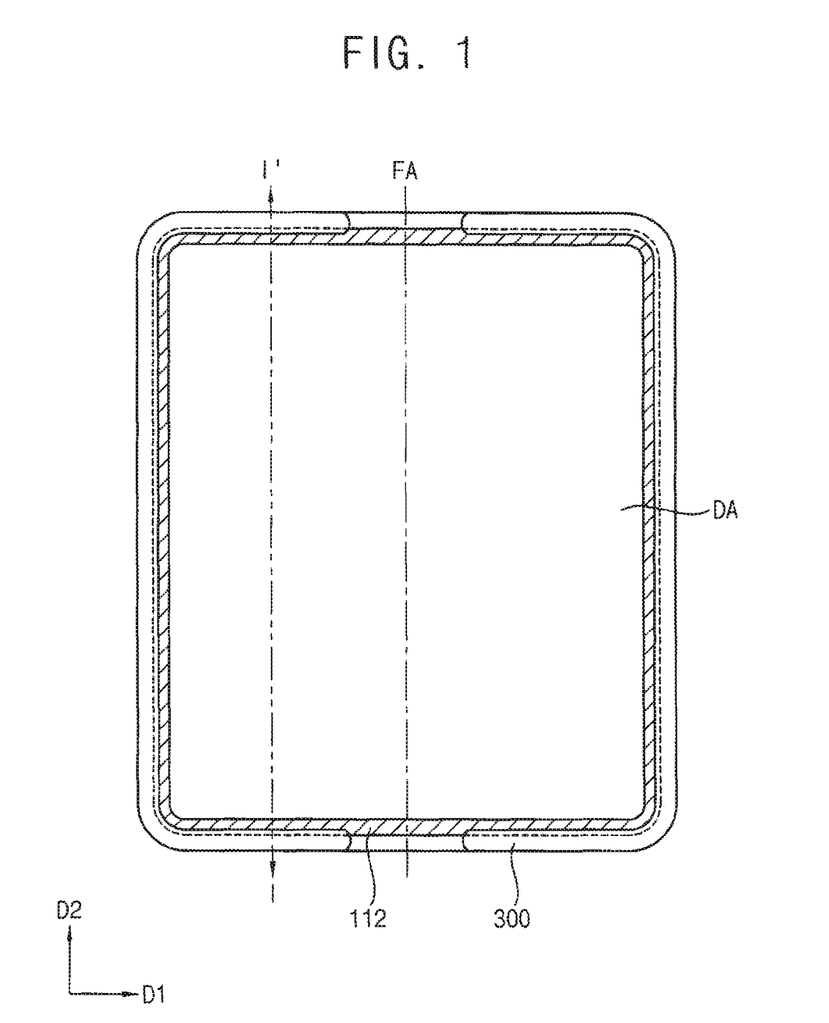
FIG. 1 is a plan view of a display apparatus according to an exemplary embodiment.
Figure 2:
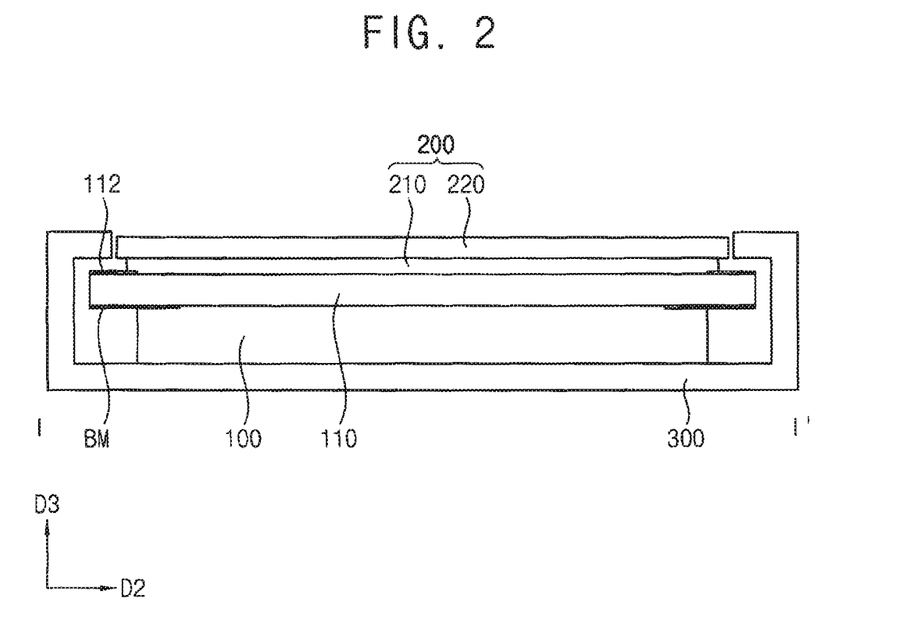
FIG. 2 is a cross-sectional view taken along line I-I' of FIG. 1.
Figure 3:
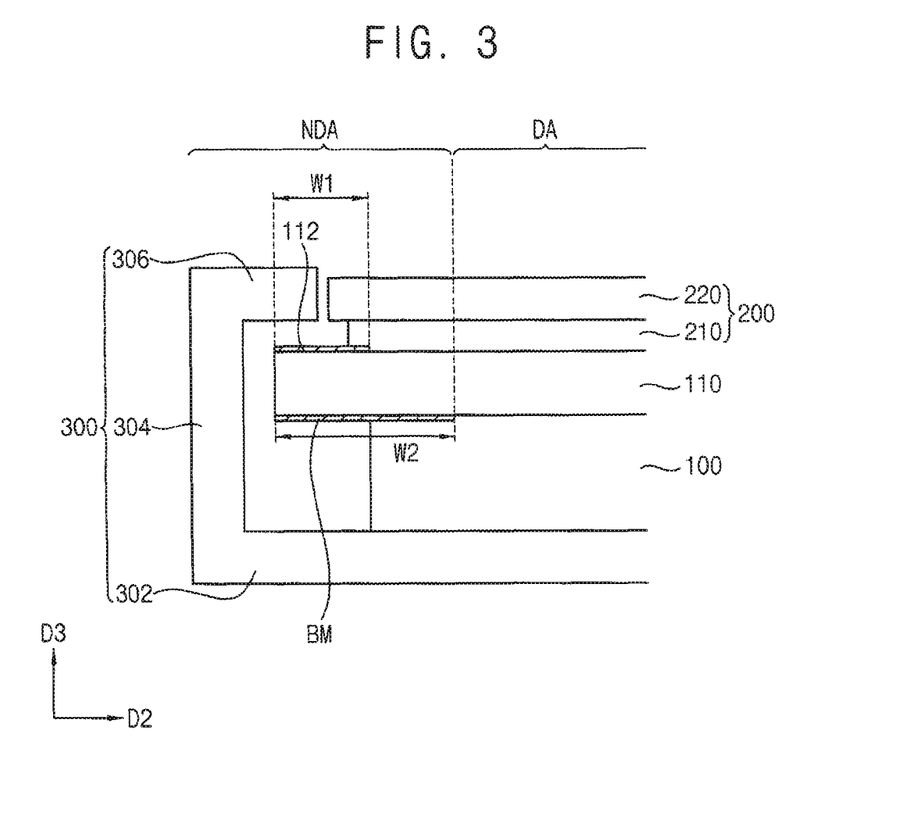
FIG. 3 is an enlarged view of an edge portion of the display apparatus of FIG. 2.

FIG. 1 is a plan view of a display apparatus according to an exemplary embodiment. FIG. 2 is a cross-sectional view taken along line I-I' of FIG. 1. FIG. 3 is an enlarged view of an edge portion of the display apparatus of FIG. 2.

Referring to FIGS. 1 to 3, the display apparatus may include a display module 100, a glass window 110, a protective film 200, and a cover 300.

The display module 100 may display an image and have flexibility. For example, the display module 100 may be a flexible organic light emitting display panel having flexibility, but is not limited thereto.

More particularly, the display module 100 may include a flexible substrate and a light emitting structure disposed on the flexible substrate. The display module 100 may include a first display area, such as a left side of a folding line FA shown in FIG. 1, on a plane formed by a first direction D1 and a second direction D2 perpendicular to the first direction D1, and a second display area spaced apart from the first display area, such as a right side of the folding line FA shown in FIG. 1, and the folding area disposed between the first display area and the second display area. The display module 100 may be folded or unfolded with reference to the folding line FA.

The glass window 110 may be disposed on the display module 100. In some exemplary embodiments, an adhesive layer may be formed between the display module 100 and the glass window 110, and the glass window 110 may be attached to the display module 100 by the adhesive layer. The glass window 110 may have a modulus of about 50 GPa (giga Pascals) or more at an edge. For example, the glass window 110 may have a modulus of about 70 GPa at the edge.

The glass window 110 may function as a protective cover of the display module 100. When the display module 100 is flexible, the glass window 110 may also have flexibility. For example, the glass window 110 may be an ultra thin glass substrate having a thickness of about 300 μm (micrometer) or less. The ultra thin glass substrate may have both small total thickness variation (TTV) with ductility and good chemical toughening performance. For example, the ultra-thin glass substrate may be an ultra-thin glass substrate having improved bending strength by performing a chemical mechanical process, a heat treatment process, or the like on a glass substrate. For example, the glass window 110 may be an ultra-thin glass substrate having a thickness of about 30 μm to about 70 μm (micrometer).

The glass window 110 may have a larger planar area than the display module 100. The glass window 110 may be disposed to protrude more than an edge of the display module 100. In particular, the glass window 110 may be longer than the display module 100 in the second direction D2.

The glass window 110 may include a flexible portion in a region corresponding to the folding area FA. The remaining areas, that is, areas corresponding to the first display area and the second display area, may be formed of a hard portion having a higher rigidity and rigid characteristics than those of the flexible portion, but are not limited thereto.

A light blocking pattern BM including a material blocking light may be formed at an edge of a bottom surface of the glass window 110 to prevent a leakage of light in the edge. The light blocking pattern BM may be partially overlapped with the display module 100. The light blocking pattern BM may be formed by coating a light blocking material on the lower surface of the glass window 110, or by attaching a light blocking film, but is not limited thereto. The light blocking pattern BM may divide the display area DA, in which an image is displayed, and the non-display area NDA.

The protective film 200 may be detachably attached to the glass window 110. The protective film 200 may include an adhesive layer 210 detachably attached to the glass window 110 and a protective layer 220 on the adhesive layer 210.

The protective film 200 may prevent breakage of the glass window 110 and prevent scattering of debris when the glass window 110 breaks. The adhesive layer 210 of the protective film 200 may include a pressure-sensitive adhesive, and the protective layer 220 may be made of plastic, such as polyethylene terephthalate (PET), polycarbonate, or the like. In this manner, the protective film 200 may be detachable without damaging the glass window 110.

The protective film 200 may have a plane area smaller than that of the glass window 110 to facilitate replacement, and may partially expose an edge portion of the glass window 110.

When folding and unfolding is repeated in the foldable display apparatus, breakage of the glass window 110 of the display apparatus may occur. Since the glass window 110 is very thin, and the surface thereof is reinforced, when the glass window 110 breaks, debris having the size of micrometers may be scattered, which may float like dusts and be inhaled by the user.

A protective coating pattern 112 may be formed on an edge of an upper surface of the glass window 110, and the protective coating pattern 112 may prevent the scattering of the debris. The protective coating pattern 112 may include a transparent or opaque material. More particularly, the protective coating pattern 112 according to an exemplary embodiment may have a modulus of about 1 GPa (Giga Pascal) or less.

For example, the protective coating pattern 112 may include urethane-based resin formed by an inkjet coating method, but is not limited thereto. As another example, the protective coating pattern 112 may be formed by coating a resin material on the edge of the glass window 110 by inkjet printing or the like, followed by a thermal process or UV curing.

The light blocking pattern BM may overlap the protective coating pattern 112. A width w2 of the light blocking pattern BM may be greater than a width w1 of the protective coating pattern 112.

The cover 300 may accommodate the display module 100 and cover an edge of the glass window 110. The cover 300 may include a bottom plate 302 extending along the first and second directions D1 and D2, a side wall 304 extending from an edge of the bottom plate 302 in a third direction D3 perpendicular to the first and second directions D1 and D2, and a top plate 306 extending in a direction substantially parallel to the bottom plate 302 from the side wall 304. The top plate 306 may be partially overlapped with the protective coating pattern 112 on a plane.

The top plate 306 may be disposed to be spaced apart from the protective film 200. In this manner, even when the cover 300 is coupled to the display module 100, the protective film 200 can be easily replaced. In addition, the protective film 200 and the cover 300 may be spaced apart from each other. Since the protective coating pattern 112 is formed in a portion where the glass window 110 can be exposed, scattering of debris can be prevented.

According to the illustrated exemplary embodiment, the protective coating pattern 112 is formed on the edge of the upper surface of the glass window 110 of the display apparatus to prevent scattering of debris. The protective film 200, which is detachable and replaceable, is attached on a display area where an image is displayed. As such, it is possible to prevent scattering of debris at the edge of the glass window 110, where the glass window 110 is not covered by protective film 200 and is exposed, by the protective coating pattern 112.

Figure 4:
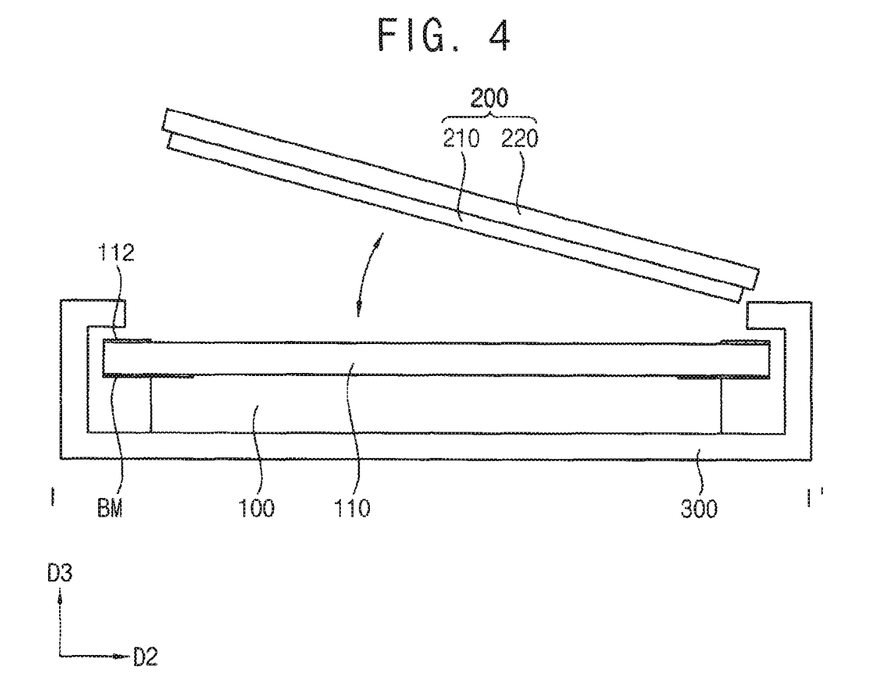
FIG. 4 is a cross-sectional view for describing reattachment of a protective film of the display apparatus of FIGS. 1 to 3.

FIG. 4 is a cross-sectional view for describing reattachment of a protective film of the display apparatus of FIGS. 1 to 3.

Referring to FIG. 4, the adhesive layer 210 of the protective film 200 may be removable from the glass window 110 without damaging the glass window 110. Accordingly, a new protective film can easily replace the previous protective film 200. At this time, since the protective coating pattern 112 is coated and formed on the glass window 110, the protective coating pattern 112 may be retained on the glass window 110 without being separated even when the protective film 200 is detached.

Figure 5:
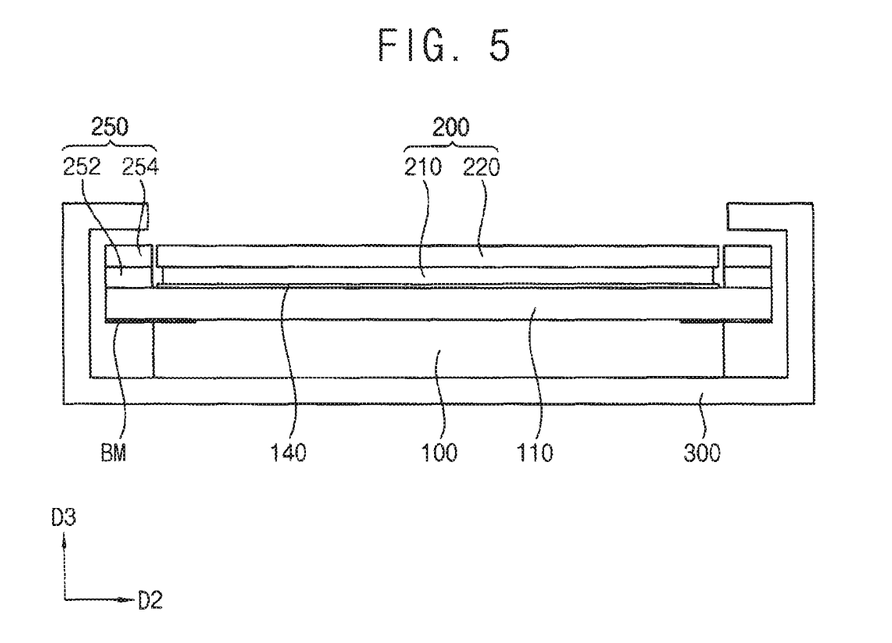
FIG. 5 is a cross-sectional view of a display apparatus according to an exemplary embodiment.

FIG. 5 is a cross-sectional view of a display apparatus according to an exemplary embodiment.

Referring to FIG. 5, the display apparatus according to the illustrated exemplary embodiment is substantially the same as the display apparatus of FIGS. 1 to 4, except that a protective pattern 250 is attached instead of a protective coating pattern. As such, repeated descriptions of substantially the same components will be simplified or omitted.

The display apparatus includes a display module 100 having flexibility, a glass window 110 disposed on the display module 100, a protective film 200 including an adhesive layer 210 detachably attached to the glass window 110 and a protective layer 220 on the adhesive layer 210, a cover 300 for receiving the display module 100 and covering an edge of the glass window 110, and a protective pattern 250 attached on an edge of an upper surface of the glass window 110.

The protective pattern 250 may include an edge adhesive layer 252 attached on the edge of the upper surface of the glass window 110, and an edge protective layer 254 on the edge adhesive layer 252. The protective pattern 250 may be disposed to overlap a top plate of the cover 300. The edge adhesive layer 252 of the protective pattern 250 may be spaced apart from the adhesive layer 210 of the protective film 200.

The edge protective layer 254 of the protective pattern 250 may include the same or different material as the protective layer 220 of the protective film 200. For example, the edge protective layer 254 of the protective pattern 250 may include plastic, such as polyethylene terephthalate (PET), polycarbonate, or the like.

The edge adhesive layer 252 of the protective pattern 250 may include an adhesive or a pressure sensitive adhesive. Once the protective pattern 250 is formed on the glass window 110, the protective pattern 250 may not need to be attached or detached as the protective film 200. As such, adhesion of the edge adhesive layer 252 may be stronger than that of the adhesive layer 210 of the protective film 200.

According to an exemplary embodiment, a functional coating layer 140 may be further formed on the upper surface of the glass window 110 between the glass window 110 and the adhesive layer 210 of the protective film 200. For example, the functional coating layer 140 may be an antireflection layer formed of an organic thin film or an inorganic thin film.

The functional coating layer 140 may not be formed in a portion where the protective pattern 250 is attached. In this case, even when the edge adhesive layer 252 of the protective pattern 250 and the adhesive layer 210 of the protective film 200 may both function as an adhesive layer, an adhesion between the glass window 110 and the edge adhesive layer 252 of the protective pattern 250 may be stronger than an adhesion between the functional coating layer 140 and the adhesive layer 210 of the protective film 200

Figure 6:
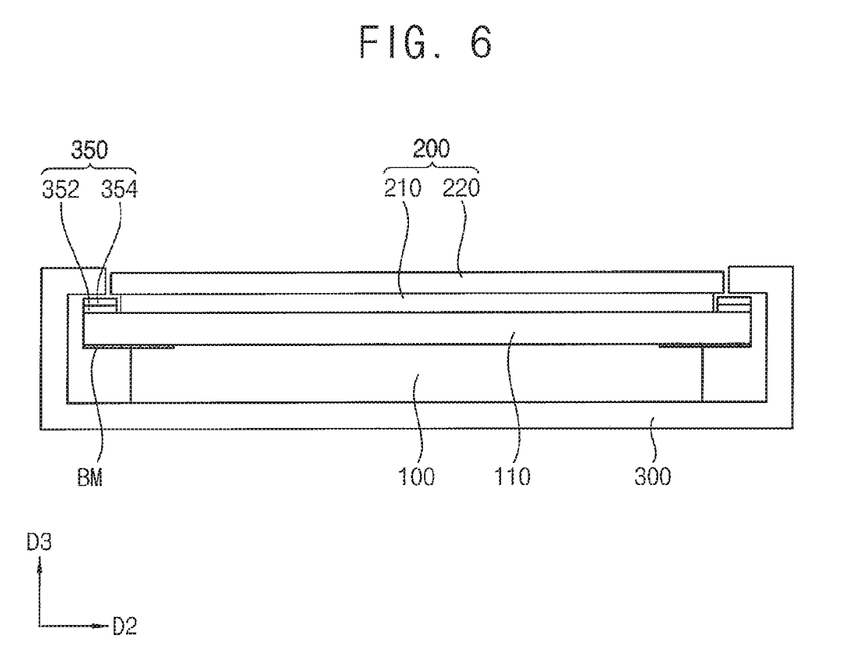
FIG. 6 is a cross-sectional view of a display apparatus according to an exemplary embodiment.

FIG. 6 is a cross-sectional view of a display apparatus according to an exemplary embodiment.

Referring to FIG. 6, the display apparatus according to the illustrated exemplary embodiment is substantially the same as the display apparatus of FIG. 5, except for a protective pattern 350. As such, repeated descriptions of substantially the same elements will be omitted.

The protective pattern 350 may include an edge adhesive layer 352 attached on an edge of an upper surface of the glass window 110, and an edge protective layer 354 on the edge adhesive layer 352. The protective pattern 350 may be disposed to partially overlap the upper plate of the cover 300.

A distance from the glass window 110 to a lower surface of the protective layer 220 of the protective film 200 may be equal to or greater than a distance from the glass window 110 to an upper surface of the edge protective layer 354 of the protective pattern 350. The protective pattern 350 may be partially overlapped with the protective layer 220 of the protective film 200.

The inventive concepts may be applied to organic light emitting display devices and various electronic devices including the same. For example, the inventive concepts can be applied to a mobile phone, a smart phone, a video phone, a smart pad, a smart watch, a tablet PC, a car navigation system, a television, a computer monitor, a notebook, and the like.

According to exemplary embodiments, a protective coating pattern is formed or a protective pattern is attached on an edge of an upper surface of a glass window of a display apparatus to prevent scattering of debris. A protective film, which is detachable and replaceable, is attached on a display area where an image is to be displayed. In this manner, scattering of debris may be prevented at the edge of the glass window, where the glass window is not covered, and is exposed.

In addition, an adhesive layer of the protective film may be removable from the glass window without damaging the glass window. Accordingly, a new protective film can easily replace the previous protective film. At this time, since the protective coating pattern is coated and formed on the glass window, the protective coating pattern may be retained on the glass window without being separated, even when the protective film 200 is detached.

In addition, since an adhesion of an edge adhesive layer of the protective pattern is stronger than an adhesion of the adhesive layer of the protective film, the protective pattern may not be detached on the glass window even when the protective film is replaced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus, comprising:
a display module having flexibility;
a glass window disposed on the display module;
a protective film including an adhesive layer detachably attached on the glass window, and a protecting layer disposed on the adhesive layer;
a cover covering an edge of the glass window and at least a portion of an upper surface of the glass window, and configured to receive the display module; and
a protective pattern including an edge adhesive layer attached on an edge of an upper surface of the glass window, and an edge protective layer disposed on the edge adhesive layer,
wherein an adhesion between the glass window and the edge adhesive layer of the protective pattern is greater than an adhesion between the glass window and the adhesive layer of the protective film,
wherein a side surface of the protective pattern and a side surface of the glass window are substantially coplanar while being spaced apart from the cover,
wherein a distance from the glass window to a lower surface of the protecting layer of the protective film is equal to or greater than a distance from the glass window to the upper surface of the edge protecting layer of the protective pattern, and
wherein the protective pattern partially overlaps the protective layer of the protective film.

2. The display apparatus of claim 1, wherein:
the cover includes a bottom plate, side wall extending from an edge of the bottom plate, and a top plate extending in a direction substantially parallel to the bottom plate; and
the top plate partially overlaps the protective pattern.

3. The display apparatus of claim 1, further comprising a functional coating layer disposed on the upper surface of the glass window between the glass window and the protective film,
wherein the adhesion between the glass window and the edge adhesive layer of the protective pattern is greater than an adhesion between the functional coating layer and the adhesive layer of the protective film.

4. A display apparatus, comprising:
a display module having flexibility;
a glass window disposed on the display module;
a protective film including an adhesive layer detachably attached on the glass window, and a protecting layer disposed on the adhesive layer;
a cover covering an edge of the glass window and configured to receive the display module;
a protective pattern including an edge adhesive layer attached on an edge of an upper surface of the glass window, and an edge protective layer disposed on the edge adhesive layer; and
a light blocking pattern disposed on an edge of a bottom surface of the glass window,
wherein an adhesion between the glass window and the edge adhesive layer of the protective pattern is greater than an adhesion between the glass window and the adhesive layer of the protective film, and
wherein the glass window has a planar area greater than that of the display module, and is disposed to protrude further outwardly than an edge of the display module.

5. A display apparatus, comprising:
a display module having flexibility;
a glass window disposed on the display module;
a protective film including an adhesive layer detachably attached on the glass window, and a protecting layer disposed on the adhesive layer;
a cover covering an edge of the glass window and at least a portion of an upper surface of the glass window, and configured to receive the display module; and
a protective pattern disposed on an edge of an upper surface of the glass window, and being partially exposed by the cover in a plan view, the protective pattern comprising a protective coating pattern disposed on the glass window,
wherein a side surface of the protective pattern is substantially flush with a side surface of the glass window while being spaced apart from the cover, and
wherein the protective coating pattern partially overlaps the protective film.

* * * * *